(12) United States Patent
Nangoy et al.

(10) Patent No.: US 9,681,497 B2
(45) Date of Patent: Jun. 13, 2017

(54) MULTI ZONE HEATING AND COOLING ESC FOR PLASMA PROCESS CHAMBER

(71) Applicant: APPLIED MATERIALS, INC., Santa Clara, CA (US)

(72) Inventors: Roy Nangoy, Santa Clara, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/762,451

(22) PCT Filed: Mar. 11, 2014

(86) PCT No.: PCT/US2014/023770
§ 371 (c)(1),
(2) Date: Jul. 21, 2015

(87) PCT Pub. No.: WO2014/164910
PCT Pub. Date: Oct. 9, 2014

(65) Prior Publication Data
US 2015/0366004 A1    Dec. 17, 2015

Related U.S. Application Data

(60) Provisional application No. 61/778,212, filed on Mar. 12, 2013.

(51) Int. Cl.
*B23K 10/00* (2006.01)
*H05B 3/00* (2006.01)
(Continued)

(52) U.S. Cl.
CPC ..... *H05B 3/0014* (2013.01); *H01L 21/67069* (2013.01); *H01L 21/67109* (2013.01);
(Continued)

(58) Field of Classification Search
CPC .. H05B 3/0014; H05B 1/0233; H05B 3/0047; H01L 21/67109; H01L 21/67248;
(Continued)

(56) References Cited

U.S. PATENT DOCUMENTS 5,802,856 A * 9/1998 Schaper ................. B01L 7/52
118/724
6,490,146 B2  12/2002 Wang et al.
(Continued)

FOREIGN PATENT DOCUMENTS

JP      2009-302223 A    12/2009
KR   10-2009-0130574 A   12/2009
KR      10-1042284 B1    7/2011

OTHER PUBLICATIONS

PCT Search Report and Written Opinion mailed Jul. 25, 2014 in related matter No. P020244PCT (PCT/US2014/023770), 8 pages total.

(Continued)

*Primary Examiner* — Mark Paschall
(74) *Attorney, Agent, or Firm* — Blakely Sokoloff Taylor Zafman LLP

(57) ABSTRACT

An electrostatic chuck assembly including a dielectric layer with a top surface to support a workpiece. A cooling channel base disposed below the dielectric layer includes a plurality of fluid conduits disposed beneath the top surface. A chuck assembly further includes a plurality of resistive heater rods spatially distribute across the chuck assembly. In embodiments, 169 heater rods and three heat transfer fluid flow controls are independently controlled during execution of a plasma etch process.

12 Claims, 7 Drawing Sheets

(51) Int. Cl.
*H01L 21/67* (2006.01)
*H01L 21/683* (2006.01)

(52) U.S. Cl.
CPC .... *H01L 21/67248* (2013.01); *H01L 21/6831* (2013.01); *H01L 21/6833* (2013.01)

(58) Field of Classification Search
CPC .......... H01L 21/6831; H01L 21/67069; H01L 21/6833; H05H 1/26
USPC .................. 219/483–487, 497, 494, 121.42; 118/724, 725; 156/345.52, 345.53; 392/416–418
See application file for complete search history.

(56) References Cited

U.S. PATENT DOCUMENTS

| | | | |
|---|---|---|---|
| 6,538,872 B1 | 3/2003 | Wang et al. | |
| 6,740,853 B1 | 5/2004 | Johnson et al. | |
| 8,226,769 B2 | 7/2012 | Matyushkin et al. | |
| 8,461,674 B2 | 6/2013 | Gaff et al. | |
| 8,546,732 B2 | 10/2013 | Singh | |
| 8,587,113 B2 | 11/2013 | Gaff et al. | |
| 8,624,168 B2 | 1/2014 | Gaff et al. | |
| 8,637,794 B2 | 1/2014 | Singh et al. | |
| 8,663,391 B2 | 3/2014 | Matyushkin et al. | |
| 8,884,194 B2 | 11/2014 | Singh et al. | |
| 8,937,800 B2 | 1/2015 | Lubomirsky et al. | |
| 9,196,514 B2 | 11/2015 | Parkhe et al. | |
| 2003/0121898 A1* | 7/2003 | Kane | C23C 16/4586 219/200 |
| 2008/0017104 A1 | 1/2008 | Matyushkin et al. | |
| 2009/0114158 A1* | 5/2009 | Zucker | C23C 14/50 118/729 |
| 2011/0024047 A1* | 2/2011 | Nguyen | C23C 14/564 156/345.51 |
| 2013/0072025 A1* | 3/2013 | Singh | H01L 21/31116 438/732 |
| 2013/0112680 A1* | 5/2013 | Moritz | H01L 21/67109 219/385 |
| 2013/0161305 A1 | 6/2013 | Ptasienski et al. | |
| 2013/0220989 A1 | 8/2013 | Pease et al. | |
| 2014/0045337 A1 | 2/2014 | Singh et al. | |
| 2014/0047705 A1 | 2/2014 | Singh et al. | |
| 2014/0048529 A1 | 2/2014 | Pease | |
| 2014/0096909 A1 | 4/2014 | Singh et al. | |
| 2014/0154819 A1 | 6/2014 | Gaff et al. | |
| 2015/0129165 A1 | 5/2015 | Parkhe et al. | |
| 2015/0155193 A1 | 6/2015 | Hsu et al. | |
| 2015/0170977 A1 | 6/2015 | Singh | |
| 2015/0187625 A1 | 7/2015 | Busche et al. | |
| 2015/0187626 A1 | 7/2015 | Parkhe et al. | |
| 2015/0211122 A1* | 7/2015 | Chang | G06F 17/18 156/345.27 |
| 2015/0228513 A1 | 8/2015 | Parkhe et al. | |
| 2015/0311105 A1 | 10/2015 | Sadjadi et al. | |
| 2015/0364354 A1 | 12/2015 | Tantiwong et al. | |
| 2015/0366004 A1 | 12/2015 | Nangoy et al. | |
| 2016/0027678 A1 | 1/2016 | Parkhe et al. | |

OTHER PUBLICATIONS

International Preliminary Report on Patentability for Application No. PCT/US2014/023770, mailed Sep. 24, 2015, 5 pages.

* cited by examiner

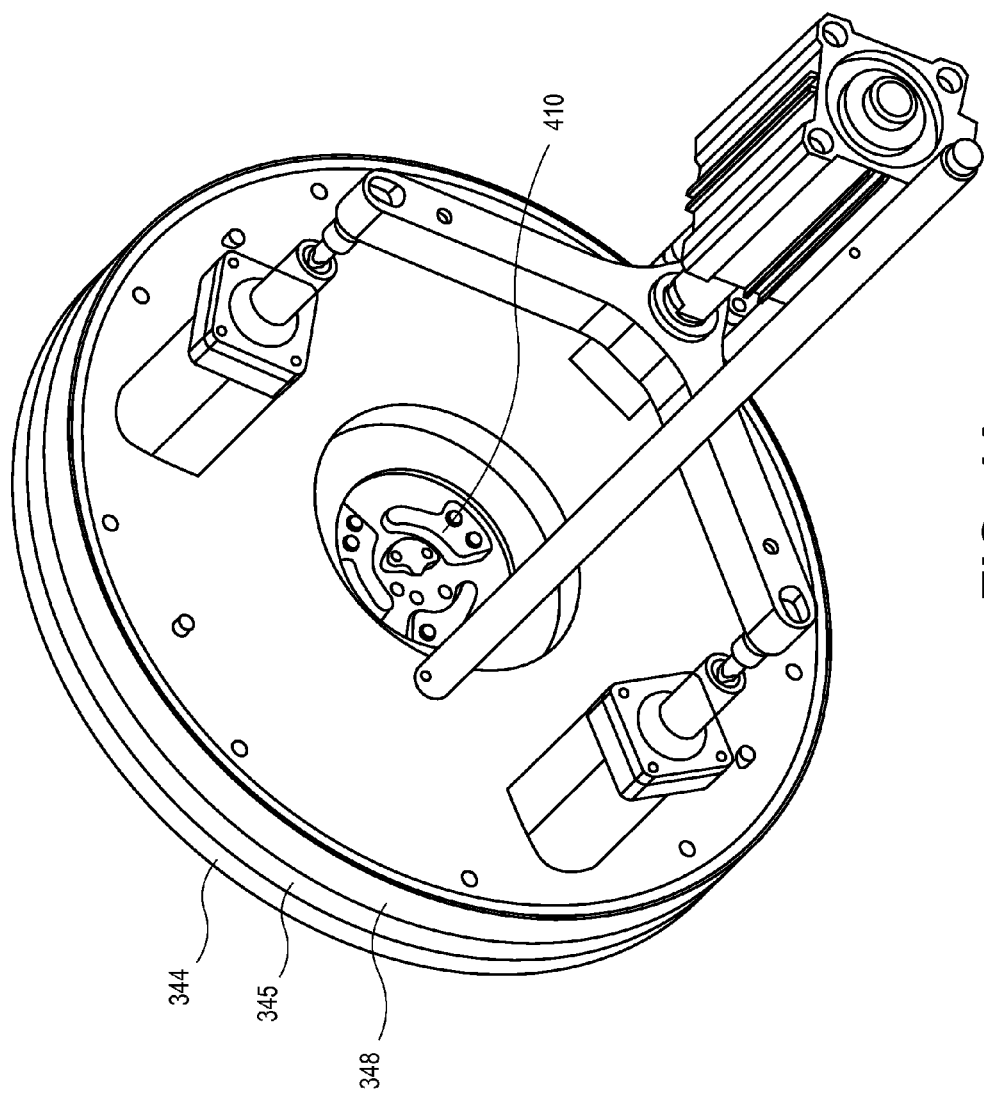

MULTI ZONE HEATING AND COOLING ESC FOR PLASMA PROCESS CHAMBER

CROSS-REFERENCE TO RELATED APPLICATIONS

This patent application is a U.S. National Phase Application under 35 U.S.C. §371 of International Application No. PCT/US2014/023770, filed Mar. 11, 2014, entitled MULTIZONE HEATING AND COOLING ESC FOR PLASMA PROCESS CHAMBER, which claims priority to the U.S. Provisional Patent Application No. 61/778,212 filed Mar. 12, 2013, and is hereby incorporated by reference.

FIELD

Embodiments of the present invention relate to the microelectronics manufacturing industry and more particularly to temperature controlled chucks for supporting a workpiece during plasma processing.

DISCUSSION OF RELATED ART

Power density in plasma processing equipment, such as those designed to perform plasma etching of microelectronic devices and the like, is increasing with the advancement in fabrication techniques. For example, powers of 5 to 10 kilowatts are now in use for 300 mm substrates. Plasma etching with such powers creates a greater heating of the surface of a wafer. With the increased power densities, enhanced cooling of a chuck is beneficial during processing to control the temperature of a workpiece uniformly.

Plasma etch processing of semiconductor wafers (e.g., silicon) requires uniform steady heating or cooling to achieve repeatable results. Process characteristics, such as: etch rate, selectivity, profile control and uniformity all depend upon the wafer's surface temperature. Helium gas is added between a chuck (e.g., electrostatic chuck, or "ESC") surface and wafer as a heat transfer medium.

SUMMARY

One or more embodiments are directed to a multi zone heating and cooling electrostatic chuck (ESC) for processing operations, such as plasma processing. In one embodiment, a chuck assembly for supporting a workpiece during a manufacturing operation. The chuck assembly includes a top surface of a dielectric layer to support the workpiece. The chuck assembly includes a plurality of resistive heater rods spatially distributed over an area of an RF powered cooling channel base disposed under the dielectric layer. The chuck assembly includes a plurality of fluid conduits in the cooling channel base. Each inner fluid conduit has a separate inlet and outlet and spans separate azimuthal angles of the chuck assembly. Each of the plurality of fluid conduits is independently controlled by a separate heat transfer fluid flow control and temperature feedback control loop.

According to one embodiment, a plasma processing apparatus includes a chamber to expose a workpiece to a plasma environment and a chuck assembly with a top surface of a dielectric layer to support the workpiece within the chamber. The chuck assembly includes a plurality of resistive heater rods spatially distributed over an area of an RF powered cooling channel base disposed beneath the dielectric layer. The chuck assembly also includes a plurality of fluid conduits in the cooling channel base. Each inner fluid conduit has a separate inlet and outlet and spans separate azimuthal angles of the chuck assembly. Each of the plurality of fluid conduits is independently controlled by a separate heat transfer fluid flow control and temperature feedback control loop.

In one embodiment, a method of plasma processing includes supporting a workpiece in a plasma chamber over a top surface of a dielectric layer of a chuck assembly. The method involves exposing the workpiece to a plasma environment in the plasma chamber. The method involves independently controlling each of a plurality of resistive heater rods to heat areas of the chuck assembly based on temperature feedback. The plurality of resistive heater rods are spatially distributed over an area of an RF powered cooling channel base disposed beneath the dielectric layer. The method also involves independently controlling each of a plurality of fluid conduits by a separate heat transfer fluid flow control to cool other areas of the chuck assembly based on the temperature feedback, wherein the plurality of fluid conduits are disposed in the cooling channel base. Each inner fluid conduit has a separate inlet and outlet and spans separate azimuthal angles of the chuck assembly.

BRIEF DESCRIPTION OF THE DRAWINGS

FIG. 4A is an isometric view of an underside of the chuck assembly in FIGS. 3A and 3B, in accordance with an embodiment;

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

Figure 1:
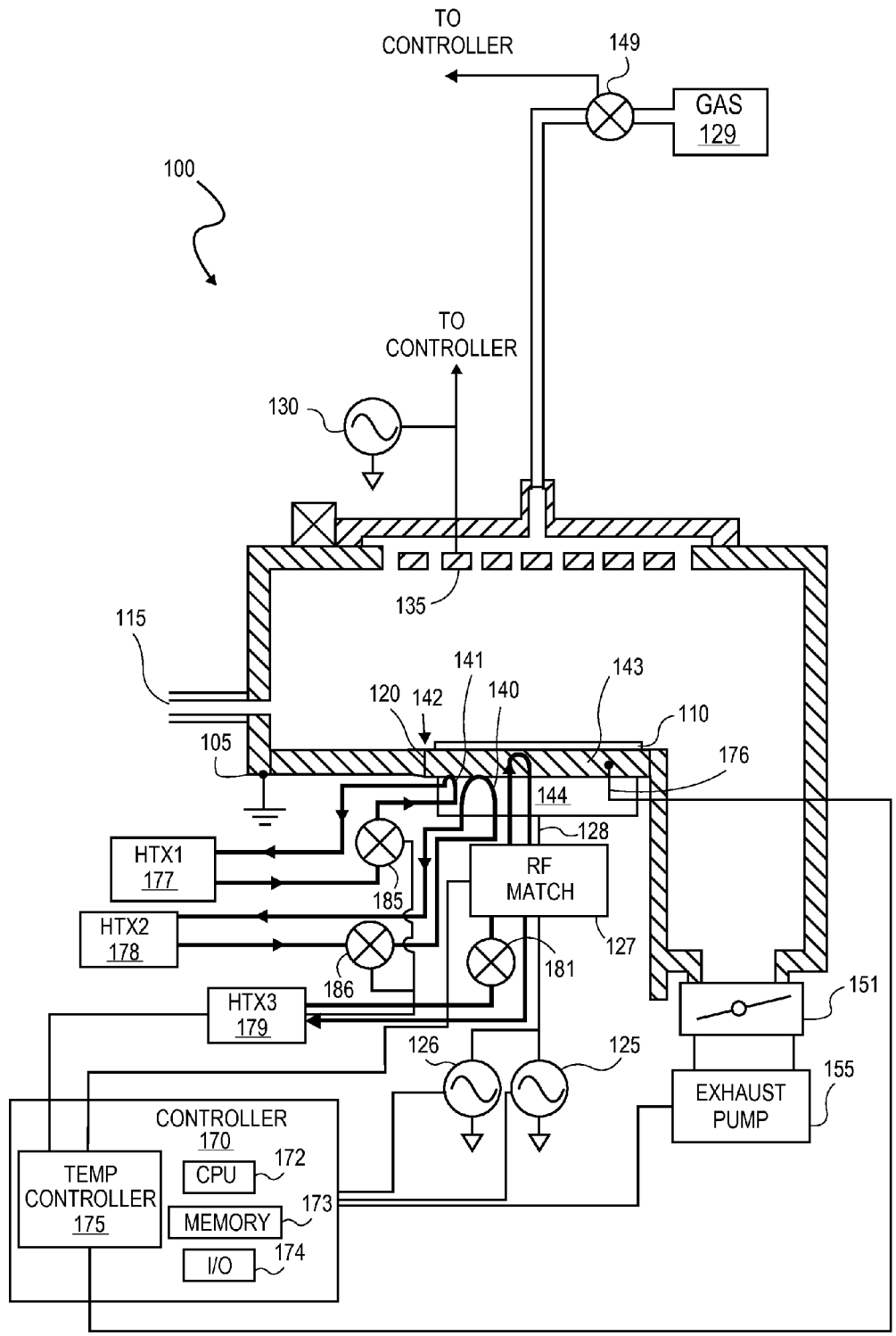
FIG. 1 is a schematic of a plasma etch system including a chuck assembly in accordance with an embodiment of the present invention.

FIG. 1 is a schematic of a plasma etch system 100 including a chuck assembly 142 in accordance with an embodiment of the present invention. The plasma etch system 100 may be any type of high performance etch chamber known in the art, such as, but not limited to, Enabler™, DPS II, AdvantEdge™ G3, E-MAX®, Axiom, or Mesa CIP chambers, all of which are manufactured by Applied Materials of CA, USA. Other commercially available etch chambers may similarly utilize the chuck assemblies described herein. While the exemplary embodiments are described in the context of the plasma etch system 100, the chuck assembly described herein is also adaptable to other processing systems used to perform any substrate fabrication process (e.g., plasma deposition systems, etc.) which place a heat load on the chuck.

Referring to FIG. 1, the plasma etch system 100 includes a grounded chamber 105. Process gases are supplied from gas source(s) 129 through a mass flow controller 149 to the interior of the chamber 105. Chamber 105 is evacuated via an exhaust valve 151 connected to a high capacity vacuum pump stack 155. When plasma power is applied to the chamber 105, a plasma is formed in a processing region over workpiece 110. A plasma bias power 125 is coupled into the chuck assembly 142 to energize the plasma. The plasma bias power 125 typically has a low frequency between about 2 MHz to 60 MHz, and may be for example in the 13.56 MHz band. In the exemplary embodiment, the plasma etch system 100 includes a second plasma bias power 126 operating at about the 2 MHz band which is connected to the same RF match 127 as plasma bias power 125 and coupled to a lower electrode 120 via a power conduit 128. A plasma source power 130 is coupled through a match (not depicted) to a plasma generating element 135 to provide high frequency source power to inductively or capacitively energize the plasma. The plasma source power 130 may have a higher frequency than the plasma bias power 125, such as between 100 and 180 MHz, and may for example be in the 162 MHz band.

A workpiece 110 is loaded through an opening 115 and clamped to a chuck assembly 142. The workpiece 110 may be any conventionally employed in the plasma processing art and the present invention is not limited in this respect. The workpiece 110 is disposed on a top surface of a dielectric layer 143 disposed over a cooling channel base 144. A clamp electrode (not depicted) is embedded in the dielectric layer 143. In particular embodiments, the chuck assembly 142 includes a plurality of zones, each zone independently controllable to a setpoint temperature. In the exemplary embodiment, the plurality of zones provides independent control over separate azimuthal angles relative to a center of the chuck. In the exemplary embodiment, three independent temperature zones are provided in the chuck with three-fold symmetry about a center of the top surface area of the chuck assembly 142.

The temperature controller 175 is to execute temperature control algorithms (e.g., temperature feedback control) and may be either software or hardware or a combination of both software and hardware. The temperature controller 175 may further comprise a component or module of the system controller 170 responsible for management of the system 100 through a central processing unit 172, memory 173, and input/output interface 174. The temperature controller 175 is to output control signals affecting the rate of heat transfer between the chuck assembly 142 and a heat source and/or heat sink external to the plasma chamber 105.

In embodiments, each of the different temperature zones is coupled to a separate, independently controlled heat transfer fluid loop with flow control that is controlled based on a temperature feedback loop unique to the zone. In the exemplary embodiment having three azimuthal temperature zones, the temperature controller 175 is coupled to a first heat exchanger (HTX)/chiller 177, a second heat exchanger/chiller 178, and a third heat exchanger/chiller 179 with each of the HTX/chillers 177, 178, 179 fluidly coupled to one of the plurality (three) temperature zones in the chuck. The temperature controller 175 may acquire the temperature setpoint of the heat exchangers 177, 178, 179 and temperatures 176 for each of the zones of the chuck assembly 142, and control heat transfer fluid flow rate through fluid conduits in the chuck assembly 142. Generally, the heat exchanger 177 is to cool a first portion of the chuck assembly 142 (e.g., over a first 120° arc spanning the radius of the chuck, which may be 150 mm or 225 mm, etc.) via a plurality of first fluid conduits 141. The heat exchanger 178 is to cool a second portion of the chuck assembly 142 (e.g., over a second 120° arc spanning the radius of the chuck) via a plurality of second fluid conduits 140. Likewise the third heat exchanger 179 is coupled through a third piping to the third zone (e.g., over a first 120° arc spanning the radius of the chuck), etc.

One or more valves 185, 186, 187 (or other flow control devices) between the heat HTX/chillers 177, 178, 179 and fluid conduits in the chuck assembly 142 may be controlled by temperature controller 175 to independently control a rate of flow of the heat transfer fluid to each of the plurality of fluid conduits 141, 142, 143. In the exemplary embodiment therefore, three heat transfer fluid loops are employed, and for each loop, any heat transfer fluid known in the art may be used. For example, the heat transfer fluid may be a liquid, such as, but not limited to an ethylene glycol/water mix.

In embodiments, the chuck assembly includes a plurality of independently controlled heater rods and a plurality of independent cooling fluid conduits. Each heater rod is a resistively heated element disposed within the chuck assembly to provide a heating power to the chuck assembly. Each rod is electrically coupled to a driver that may either provide pulsed power (e.g., a PWM mode) or continuous mode power. In embodiments, the heater rods are oriented with their longitudinal axis perpendicular to the top surface of the chuck assembly to maximize spatial packing density. The heater rod material may be a metal, such as stainless steel, or a ceramic.

Figure 2:
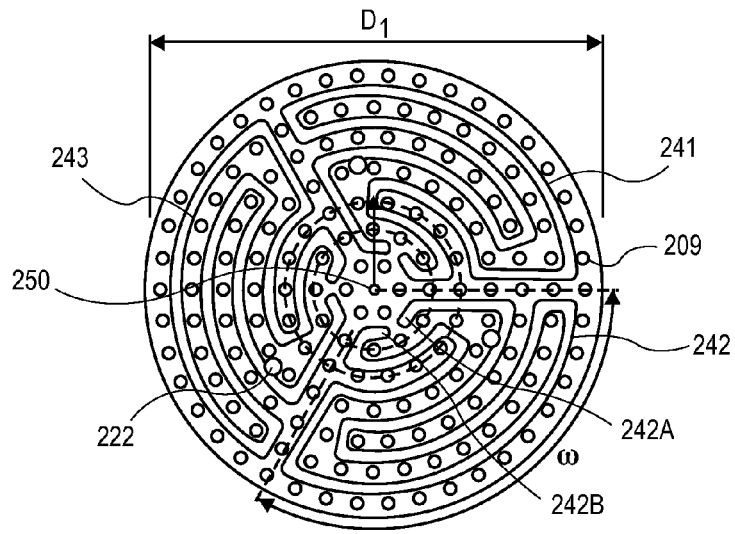
FIG. 2 is a plan view of a chuck assembly including a plurality of heating rods and a plurality of cooling fluid conduits, in accordance with an embodiment of the present invention.

FIG. 2 illustrates a top-down plan view of the chuck assembly 142 without the dielectric layer 143. The top transverse sectional surfaces of the heater rods 209 are visible. In embodiments where the diameter of the chuck, $D_1$, is smaller than 450 mm (e.g., a chuck configured to accommodate a 300 mm workpiece), there are 169 heater rods 209 disposed within the chuck assembly. 169 heater rods 209 is advantageous in that a large array (13×13) of elements may be individually controlled as mapped over the spatial area of the chuck assembly to achieve a level of precision unobtainable by designs with fewer elements. For example, even a 12×12 array (144 elements) would lead to a significantly more discrete heating power application. This may be important when, for example, a relatively higher power must be applied to each individual heater rod 209 as the number of rods decreases to achieve a given heating power. This higher individual heater power would lead to hot spots spatially distributed across the chuck surface where the thermal resistance between adjacent heater rods is significant, as it may be where a thin ceramic puck serves as the dielectric 143 (illustrated in FIG. 1). For example, in certain embodiments, the ceramic puck thickness may only be 0.5 mm-1 mm including the bonding media, which in one embodiment is a metal for better thermal conductivity and resistance to plasma attack. However, other embodiments may include other numbers of heater rods 209 (e.g., fewer than or more than 169 heater rods 209). In the depicted embodiment, the 169 heater rods 209 are spatially arranged as eight concentric rings of incrementally increasing radii (highlighted with dashed lines). For this particular heater rod layout for example, 144 rods would result in a larger arc distance between adjacent rods than for the advantageous embodiments with 169 heater rods 209. In embodiments wherein the diameter $D_1$ is sufficient for a 450 mm diameter workpiece, a greater number of heater rods are present than in the depicted embodiment, for example to maintain a same spatial density of heater rod elements.

A plurality of fluid conduits 241, 242, and 243 are further illustrated in FIG. 2. The fluid conduits are dimensioned to pass a heat transfer fluid at a desired flow rate for pressures typical in the art (e.g., 3 PSI). The fluid conduits are routed around the heater rods 209, as well as other less numerous objects in the base, such as lift pin through holes 222 and a central axis 250 dimensioned to clear a conductor to provide DC voltage to an ESC clamp electrode. As further shown, each of the fluid conduits spans an equal azimuthal angle ω for three-fold symmetry. In the exemplary embodiment each fluid conduit has an inlet (e.g., 242A), and an outlet (e.g., 242B) that is proximate the chuck center 250, and more particularly between an inner most ring of heater rods 209 and the adjacent ring of heater rods 209 (i.e., the second inner more ring). Each fluid conduit is folded back on itself to form a counter current conduit pair that is separated over the length of the conduit run (from inlet to outlet) by one ring of heater rods 209. As the folded conduit pair meanders radially, turns are made to run over an arc length within the azimuthal angle ω between successive rings of heater rods 209. With the exemplary eight concentric rings of heater rods 209, the fluid conduit makes twelve turns (corners) such that the innermost heater rods are surrounded by the lowest temperature fluid on one side (e.g., at smaller radius) and highest temperature fluid on the opposite side (e.g., at larger radius) for an average fluid temperature approximately equal to that which occurs at the outermost ring of heater rods 209.

Figure 3A:
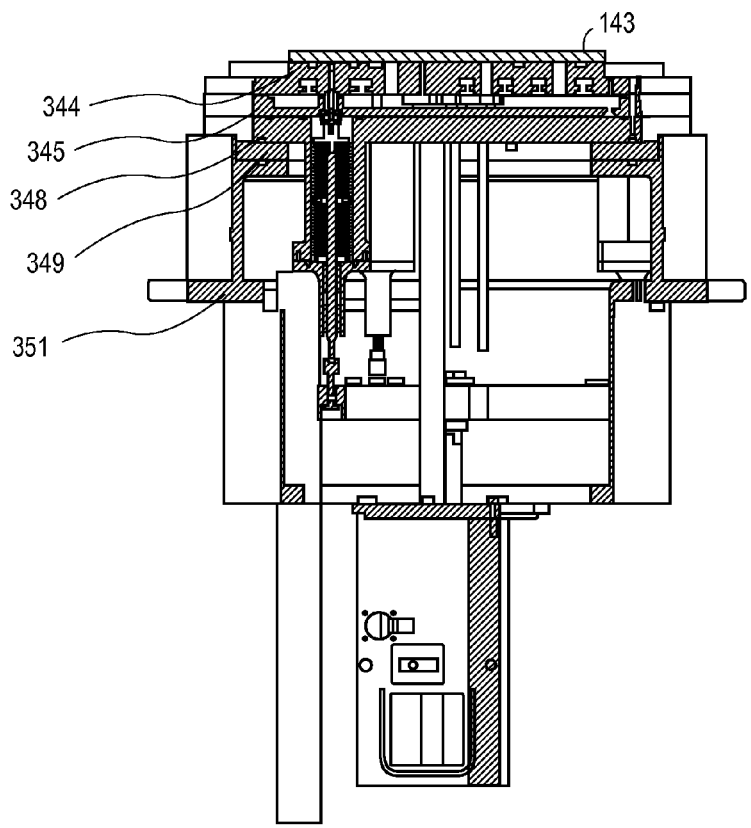
FIG. 3A is a cross sectional view of a chuck assembly, in accordance with an embodiment of the present invention.

FIG. 3A is a cross sectional view of the chuck assembly 142, in accordance with an embodiment of the present invention. As visible in FIG. 3A, the chuck assembly 142 includes a cooling channel base 344 disposed over a backing plate 345, which is further disposed of a base plate 348. The backing plate 345, the cooling channel base 344, and base plate 348 are all RF powered and so in the exemplary embodiments are each made of electrically conductive materials (e.g., aluminum) and are in mechanical contact with one another. Disposed below the base plate 348 is an annular dielectric spacer ring 349 to electrically isolate the RF power portions of the assembly 142 from the portions maintained at RF ground (e.g., 351, etc.).

Figure 3B:
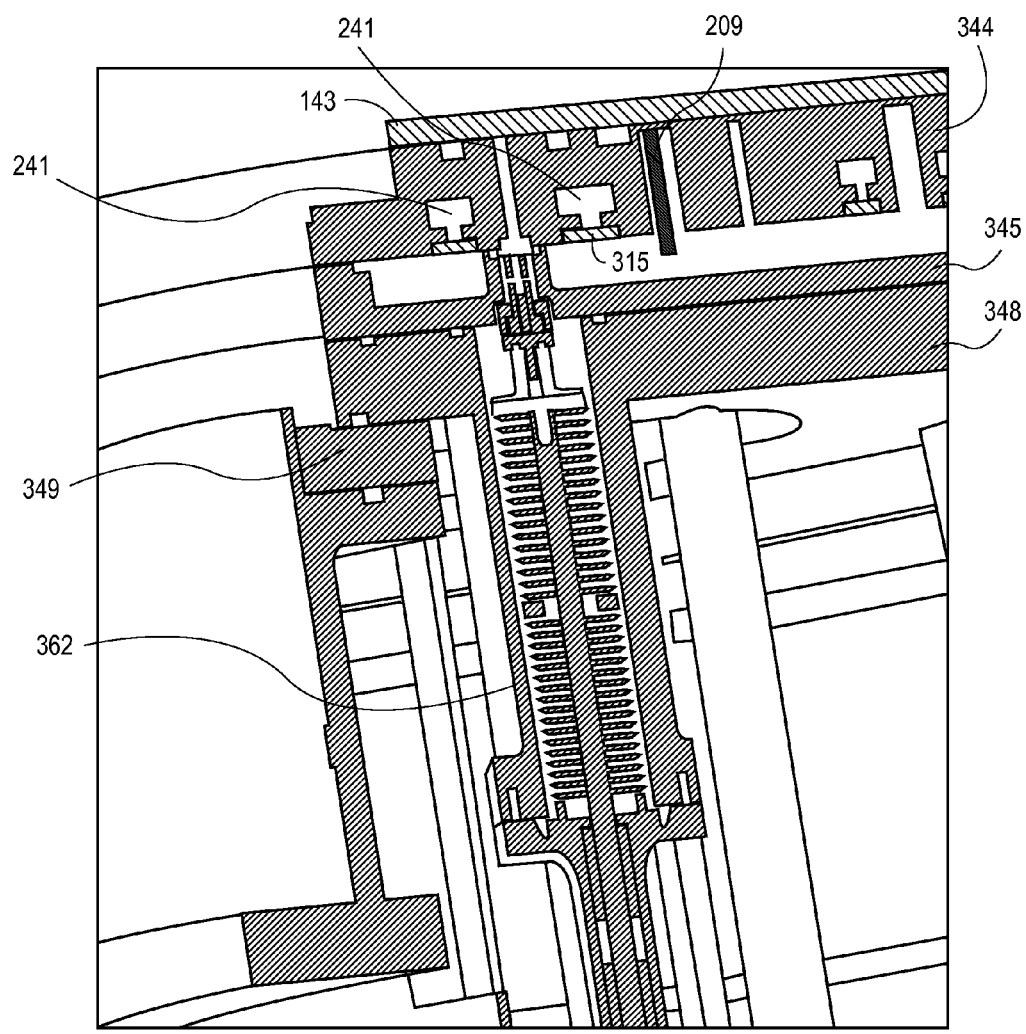
FIG. 3B is an isometric sectional view of the chuck assembly in FIG. 3A, in accordance with an embodiment.

FIG. 3B is an isometric sectional view of the chuck assembly in FIG. 3A, in accordance with an embodiment. FIG. 3B is an expanded view of the top surface of the cooling channel base 344, backing plate 345, and base plate 348. As illustrated, fluid conduits 241 are capped by weld covers 315. A lifter pin sub-assembly 362 is shown as is an individual heater rod 209. In embodiments, as shown in FIG. 3B, the heater rods 209 are disposed below a thickness of the cooling channel base 344. In other words, the heater rods 209 are disposed within blind recesses in the cooling channel base 344. In certain such embodiments, the heater rods 209 are configured for tip heating with a thermally conductive connection maintained between a longitudinal end of the heater rod and a top surface of the cooling channel base 344. In one such embodiment, the thickness of the cooling channel base portion disposed over the heater rod 209 (e.g., 210 in FIG. 3B) is sufficiently thick so as to reduce the amount of RF induced on each heater rod 209. This reduced RF is a function of the skin effect associated with a given frequency of RF applied to the RF hot portions of the chuck assembly 142. Reduced RF on the heater rods 209 enables RF filtering on the heater rods 209 to be smaller (i.e., physically smaller chokes) for reduced cost, which can be important given the potential number of heater rods 209 (e.g., 169, or more). Indeed, in some embodiments, no RF filters are present on the heater rod circuits. According to an embodiment, the cooling channel base 344 has a thickness sufficient to prevent excessive bowing resulting from vacuum pressure.

In alternative embodiments, the heater rods 209 may be disposed in through holes that pass completely through the entire thickness of the cooling channel base 344 such that the heater rods 209 are free to contact the overlying ceramic puck (dielectric 143 in FIG. 1). For certain such embodiments, the heater rods 209 are configured for sidewall heating and a conductive path is maintained between a sidewall of the through holes in the cooling channel base 344 and the heater rods 209.

In embodiments, the heater rods 209 are coupled to a member capable of undergoing elastic strain and/or a fluidic thermal conductor to accommodate thermal expansion of the heater rods 209 and/or cooling channel base 344. The strainable member is to maintain thermal contact between the heater rods and the surrounding bulk assembly (e.g., cooling channel base 344) over a wide operating temperature range. In embodiments, the strainable member is one or more of a clip, spring, silicon pad, or elastic metal sleeve. The fluidic thermal conductor is also to maintain thermal contact between the rod and cooling base, but is a flowable thermally conductive material capable of filling voids as they form between the heater rod 209 and cooling channel base 344 and extruding as the voids disappear between the heater rod 209 and base 344, as a function of temperature. Exemplary fluidic thermal conductor materials include the heat transfer fluid that passes through the fluid conduits 241, 242, 243, or any conventional thermal interface material TIM (thermal paste or grease compounds, gels, and the like which may further have metallic particles, such as silver, suspended in a flowable matrix).

Figure 3C:
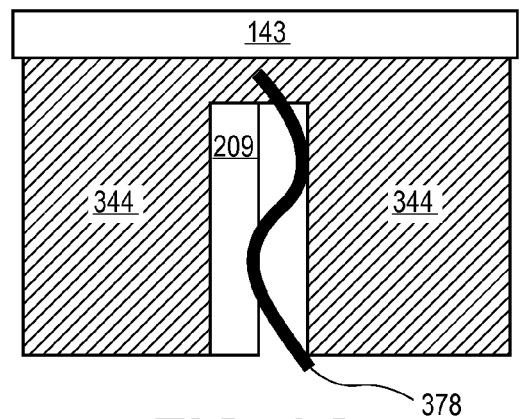
FIGS. 3C, 3D, and 3E illustrate schematics of various elements and techniques to maintain thermal contact between a heater rod and a surrounding chuck assembly, in accordance with embodiments.
Figure 3D:
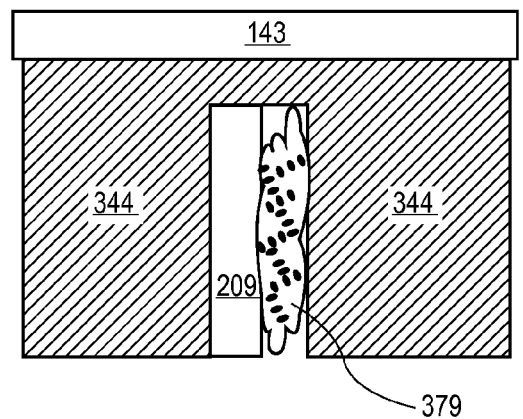
Figure 3E:
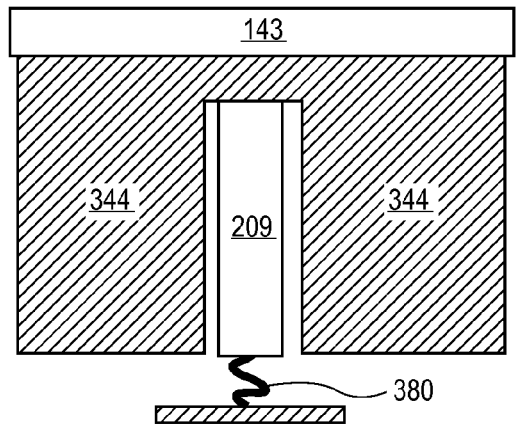

FIGS. 3C, 3D, and 3E illustrate schematics of various elements and techniques to maintain thermal contact between a heater rod and a surrounding chuck assembly, in accordance with embodiments. FIG. 3C illustrates a heater rod 209 disposed within a blind hole in the cooling channel base 344 with a clip 378 maintaining a spring force between opposing sidewalls of the heater rod 209 and cooling channel base 344. Such an embodiment may be utilized, for example, where the heater rod 209 is configured for sidewall heating.

FIG. 3D illustrates a heater rod 209 disposed within a blind hole in the cooling channel base 344 with a fluidic thermal conductor material, or compressible thermal conductor material 379. In one embodiment, the compressible thermal conductor material 379 comprises a silver or mercury-based amalgam. For fluidic thermal conductor embodiments, an non-compressible thermally conductive fluid flows into and out of regions of variable volume between the heater rod 209 and cooling channel base 344 (as denoted by the dashed arrows). A pressurized reservoir, for example common to all heater rods, may maintain an appropriate volume of the fluidic thermal conductor material. Alternatively, a small portion of the heat transfer fluid passed through the conduits 241, 242, 243 may surround all heater rods as maintained by the heat transfer fluid loop. For compressible thermal conductor embodiments, such as a silicone pad, or like material, rather than flow, internal elastic strain accommodates thermal expansion.

FIG. 3E illustrates a heater rod 209 disposed within a blind hole in the cooling channel base 344 with a spring-loaded heater rod 209. Such an embodiment, with a rod end spring 380 compressed between a rod end and a reference surface (e.g., base plate 348), may be utilized where the heater rod 209 is configured for tip heating, for example.

Figure 4B:
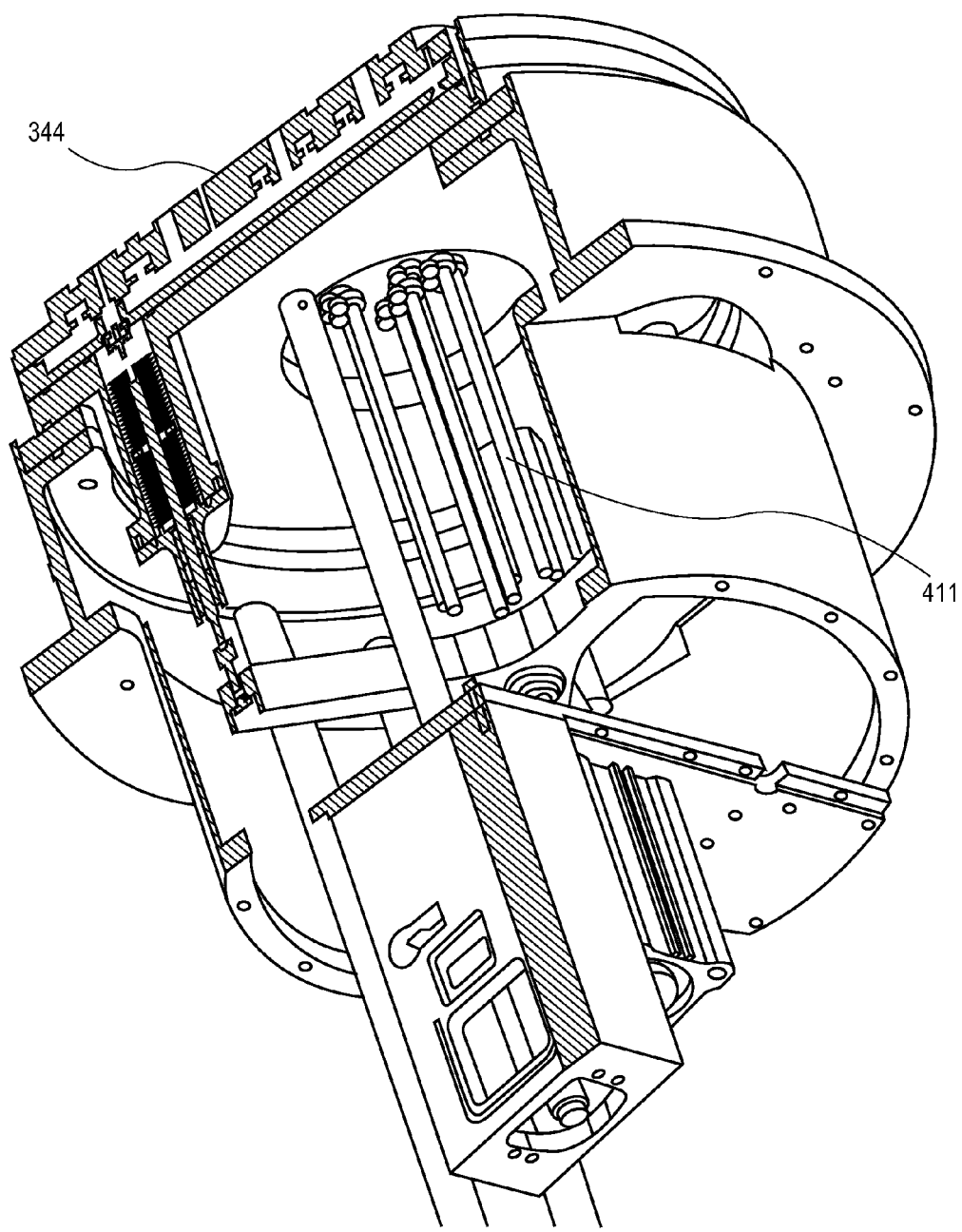
FIG. 4B is an isometric view of an underside of the chuck assembly in FIG. 4A, in accordance with an embodiment.

FIGS. 4A and 4B are isometric views of an underside of the chuck assembly 142, in accordance with an embodiment. As shown in FIG. 4A, the base plate 348 and backing plate 345 are annular with a center opening to accommodate the heat transfer fluid plumbing to the three separate inlet/outlet fittings 410, and to further accommodate a heater rod wire harness supporting the plurality of heater rods (e.g., 169 two conductor wires with a pair to each rod for fully isolated heater rod embodiments advantageous where RF filtering is needed, or 170 single conductor wires where a common heater ground is employed). As shown in FIG. 4B, pairs of fluid conduit lines 411, each fluidly coupled to one of the fluid conduits 141, 142, 143 (FIG. 2) through the fittings 410, drop down through the chamber bottom to the remote HTX 177, 178, and 179 (FIG. 1).

Figure 5:
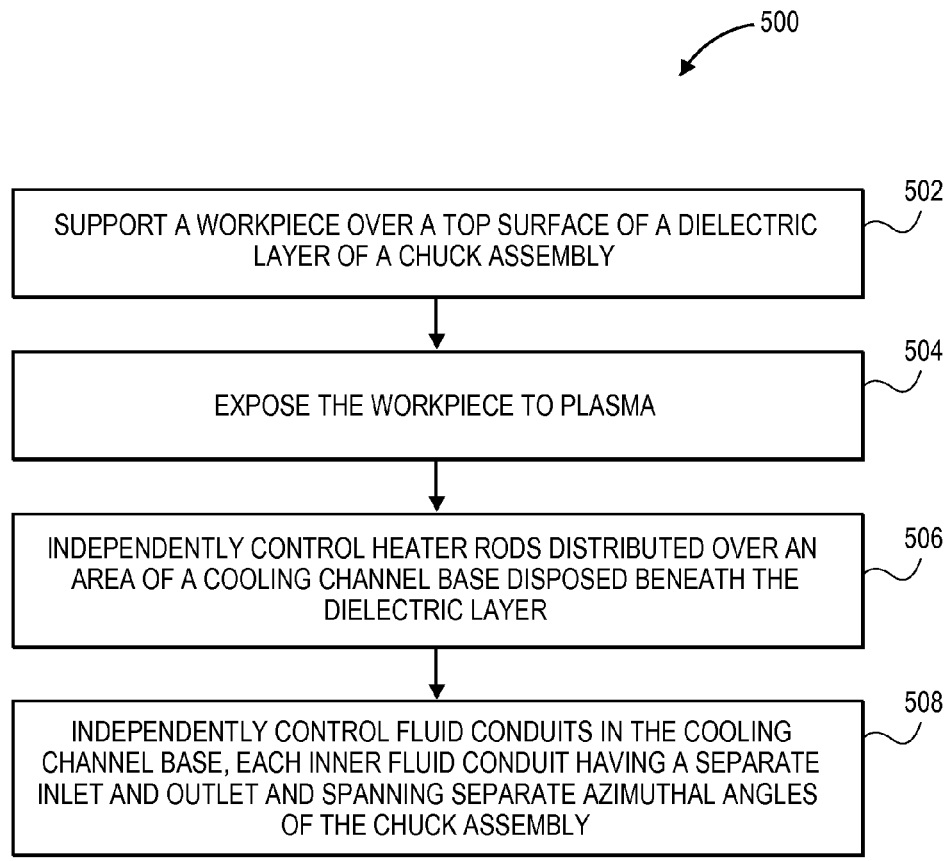
FIG. 5 is a flow chart of a method of plasma processing, in accordance with an embodiment.

FIG. 5 is a flow diagram of a method 500 of plasma processing, in accordance with an embodiment. The method 500 begins at operation 502 with supporting a workpiece in a plasma chamber over a top surface of a dielectric layer of a chuck assembly. The chuck assembly includes a plurality of resistive heater rods and fluid conduits, and may be the same or similar to any of the workpieces and chuck assemblies described above with respect to FIGS. 1-4B. According to one embodiment, the plurality of resistive heater rods are spatially distributed over an area of an RF powered cooling channel base disposed beneath the dielectric layer. The plurality of fluid conduits are disposed in the cooling channel base. In one embodiment, each inner fluid conduit has a separate inlet and outlet and spans separate azimuthal angles of the chuck assembly (e.g., such as the fluid conduits 241, 242, and 243 of FIG. 2).

The workpiece supported over the chuck assembly is exposed to a plasma environment in the plasma chamber, at operation 504. During plasma processing, the temperature of different zones of the chuck assembly can then be tuned by independently controlling each of a plurality of resistive heater rods to heat areas of the chuck assembly, and the plurality of fluid conduits to cool areas of the chuck assembly, based on temperature feedback at operations 506 and 508.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A chuck assembly for supporting a workpiece during a manufacturing operation, the chuck assembly comprising:
a top surface of a dielectric layer to support the workpiece;
a plurality of resistive heater rods spatially distributed over an area of an RF powered cooling channel base disposed under the dielectric layer, wherein the plurality of resistive heater rods comprises at least 169 rods oriented with their longitudinal axis perpendicular to the top surface of the dielectric layer; and
a plurality of fluid conduits in the cooling channel base, each fluid conduit having a separate inlet and outlet and spanning separate azimuthal angles of the chuck assembly, wherein each of the plurality of fluid conduits is independently controlled by a separate heat transfer fluid flow control and temperature feedback control loop to provide corresponding separate independently controllable azimuthal temperature zones, wherein the plurality of fluid conduits further comprises three fluid conduits spanning a same azimuth angle of approximately 120°, and wherein the plurality of resistive heater rods comprise at least eight concentric rings of heater rods with a length of each fluid conduit adjacent to each heater rod ring.

2. The chuck assembly of claim 1, wherein the heater rods are disposed below a thickness of the cooling channel base and wherein heater circuits associated with the heater rods include no RF filtering.

3. The chuck assembly of claim 1, wherein each heater rod is coupled to an elastically deformable member and/or a fluidic thermal conductor to accommodate thermal expansion of the heater rods and/or cooling channel base.

4. The chuck assembly of claim 3, wherein the deformable member is to maintain thermal contact between the heater rods and a surrounding bulk assembly over an operating temperature range.

5. The chuck assembly of claim 4, wherein the deformable member is one or more of a clip, spring, silicone pad, or elastic metal sleeve.

6. The chuck assembly of claim 3, wherein the fluidic thermal conductor is thermally conductive paste or gel, or is the heat transfer fluid.

7. The chuck assembly of claim 1, wherein the dielectric layer is bonded to the cooling channel base with a metallic bonding media and wherein the dielectric layer and the bonding media combined have a thickness between 0.5 mm and 1 mm.

8. The chuck assembly of claim 1, wherein each of the plurality of fluid conduits has an inlet and outlet proximate to a center of the chuck assembly with both a first and second half length of each fluid conduit spanning a same radial distance of the chuck assembly.

9. A plasma processing apparatus, comprising:
a chamber to expose a workpiece to a plasma environment; and
a chuck assembly with a top surface of a dielectric layer to support the workpiece within the chamber, wherein the chuck assembly comprises:
a plurality of resistive heater rods spatially distributed over an area of an RF powered cooling channel base disposed beneath the dielectric layer;
a plurality of fluid conduits in the cooling channel base, each fluid conduit having a separate inlet and outlet and spanning separate azimuthal angles of the chuck assembly, wherein each of the plurality of fluid conduits is independently controlled by a separate heat transfer fluid flow control and temperature feedback control loop to provide corresponding separate independently controllable azimuthal temperature zones;
a first heat transfer fluid source coupled to a first of the fluid conduits through a first fluid flow control valve;
a second heat transfer fluid source coupled to a second of the fluid conduits through a second fluid flow control valve; and
a third heat transfer fluid source coupled to a third of the fluid conduits through a third fluid flow control valve.

10. The apparatus of claim 9, further comprising an RF source, the RF source powering the cooling channel base, a backing plate, and a base plate.

11. The apparatus of claim 10, wherein three pairs of heat transfer lines, each pair coupled to one of the heat transfer fluid sources pass through a central axis of the base plate and the backing plate to couple to fittings on the cooling channel base.

12. A plasma processing apparatus, comprising:
a chamber to expose a workpiece to a plasma environment; and
a chuck assembly with a top surface of a dielectric layer to support the workpiece within the chamber, wherein the chuck assembly comprises:
a plurality of resistive heater rods spatially distributed over an area of an RF powered cooling channel base disposed beneath the dielectric layer;
a plurality of fluid conduits in the cooling channel base, each fluid conduit having a separate inlet and outlet and spanning separate azimuthal angles of the chuck assembly, wherein each of the plurality of fluid conduits is independently controlled by a separate heat transfer fluid flow control and temperature feedback control loop to provide corresponding separate independently controllable azimuthal temperature zones; and
a controller to control the flow rate or temperature of a heat transfer fluid through each of the plurality of fluid conduits independently while executing a plasma etch process on the workpiece.

* * * * *